(12) United States Patent
Otsuki et al.

(10) Patent No.: US 6,621,120 B2
(45) Date of Patent: Sep. 16, 2003

(54) SEMICONDUCTOR DEVICE

(75) Inventors: Masahito Otsuki, Nagano (JP); Seiji Momota, Nagano (JP); Mitsuaki Kirisawa, Nagano (JP); Takashi Yoshimura, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/073,683

(22) Filed: Feb. 11, 2002

(65) Prior Publication Data

US 2002/0121660 A1 Sep. 5, 2002

(30) Foreign Application Priority Data

Feb. 9, 2001 (JP) .......................................... 2001-034543

(51) Int. Cl.[7] .............................................. H01L 29/74
(52) U.S. Cl. ...................... 257/327; 257/262; 257/133; 257/339; 257/342; 257/341; 257/343; 257/332; 257/333; 257/334; 257/335; 438/135; 438/212; 438/268
(58) Field of Search ................................ 257/327, 262, 257/133, 341, 146, 343, 370, 330, 332, 333, 334, 335; 438/135, 212, 268

(56) References Cited

U.S. PATENT DOCUMENTS

| 5,136,349 A | * | 8/1992 | Yilmaz et al. ............. 357/23.4 |
| 5,262,336 A | * | 11/1993 | Pike, Jr. et al. ............... 437/31 |
| 5,276,339 A | * | 1/1994 | Fujisima ..................... 257/127 |
| 5,714,774 A | * | 2/1998 | Otsuki et al. ............... 257/138 |
| 5,828,101 A | * | 10/1998 | Endo .......................... 257/330 |
| 6,309,920 B1 | * | 10/2001 | Laska et al. ................. 438/202 |
| 6,365,932 B1 | * | 4/2002 | Kouno et al. ............... 257/341 |

OTHER PUBLICATIONS

US 5,732,890, 3/1998, Fujihira et al. (withdrawn)*
"The Field Stop IGBT (FS IGBT)—A New Power Device Concept with a Great Improvement Potential"; Laska et al.; ISPSD'2000, May 22–25; Toulouse, France; 2000 IEEE; pp. 355–358.

* cited by examiner

Primary Examiner—Nathan J. Flynn
Assistant Examiner—Fazli Erdem
(74) Attorney, Agent, or Firm—Rossi & Associates

(57) ABSTRACT

A semiconductor device constituting an IGBT exhibits low losses yet can be manufactured using an inexpensive wafer and with high yields, and exhibits low losses. The IGBT is produced by using a wafer, for example an FZ wafer, that is cut form an ingot and has its surface polished and cleaned, wherein an n-type impurity diffusion layer having an enough dose to stop the electric field in turn-off is provided between a collector layer and a base layer as a field-stop layer for stopping an electric field in turn-off. The thickness of this field-stop layer defined by $X_{fs}-X_j$ is controlled in the range from 0.5 μm to 3 μm, where $X_{fs}$ is the position at which the impurity concentration in the field-stop layer is twice the impurity concentration of the base layer, and $X_j$ is the position of the junction between the filed-stopping layer and the collector layer.

8 Claims, 13 Drawing Sheets

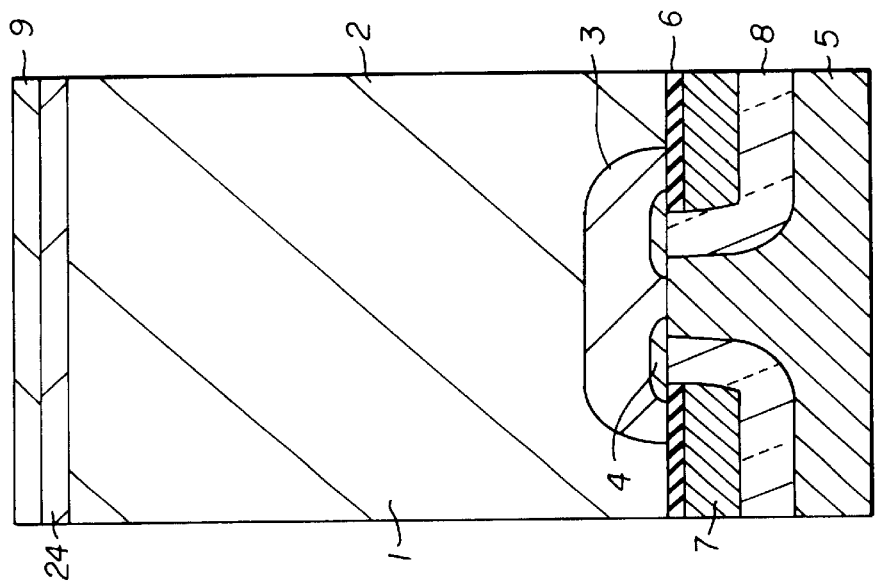
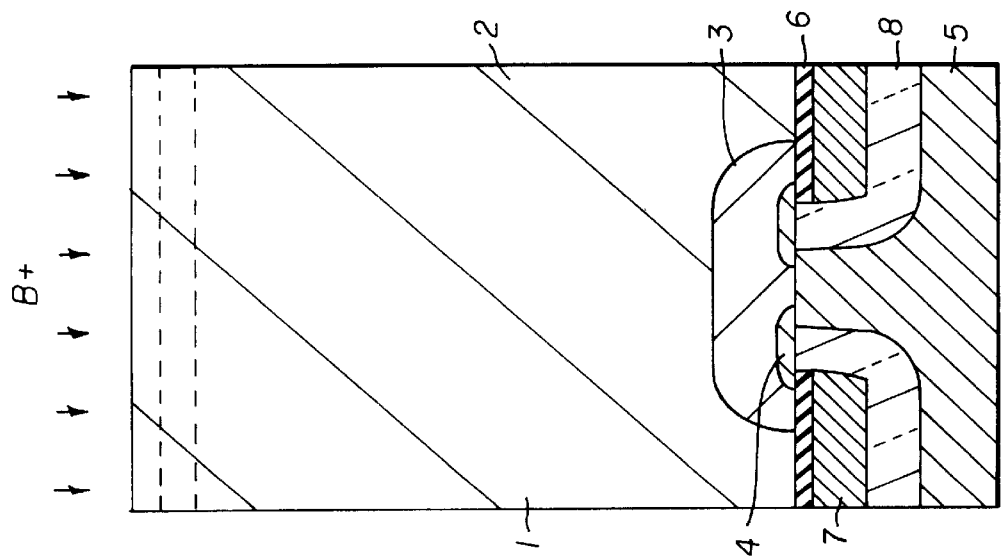
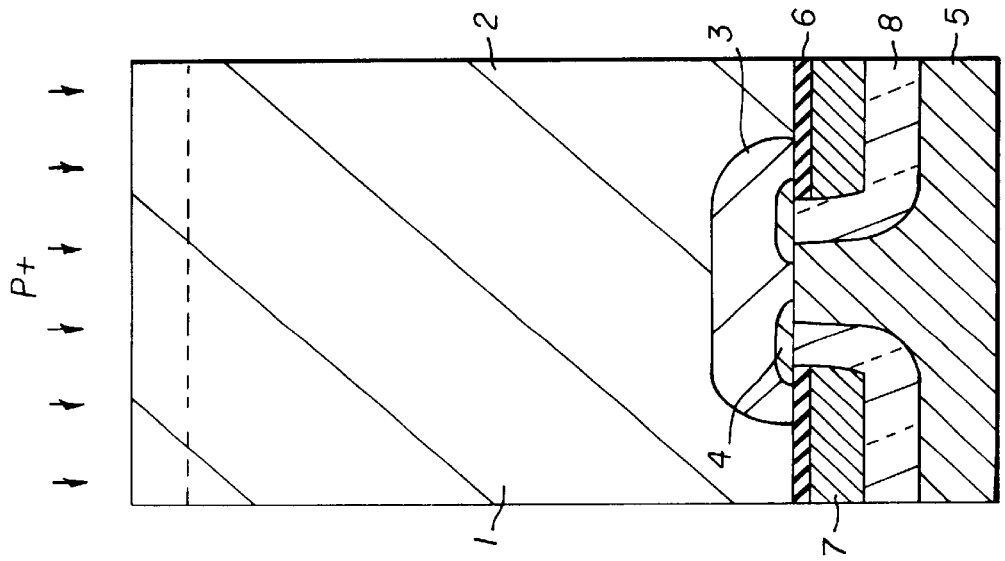

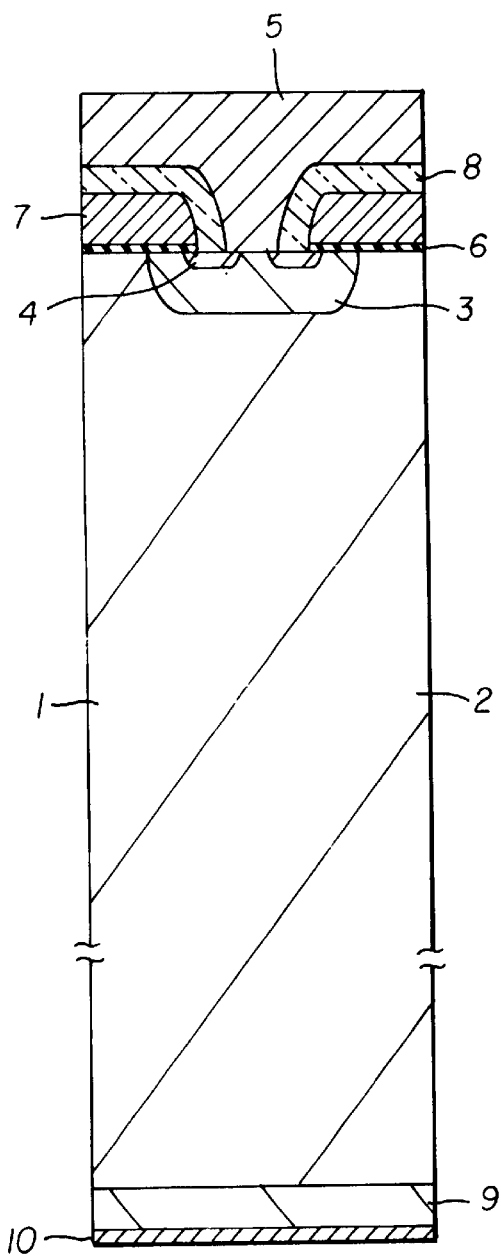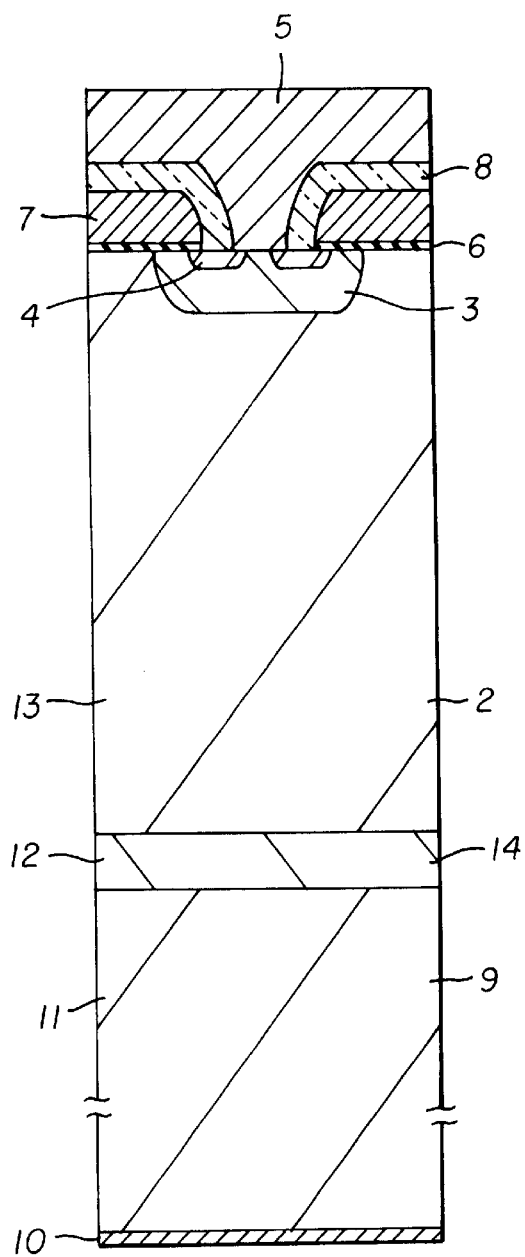
FIG. 25
(Prior Art)
FIG. 26
(Prior Art)

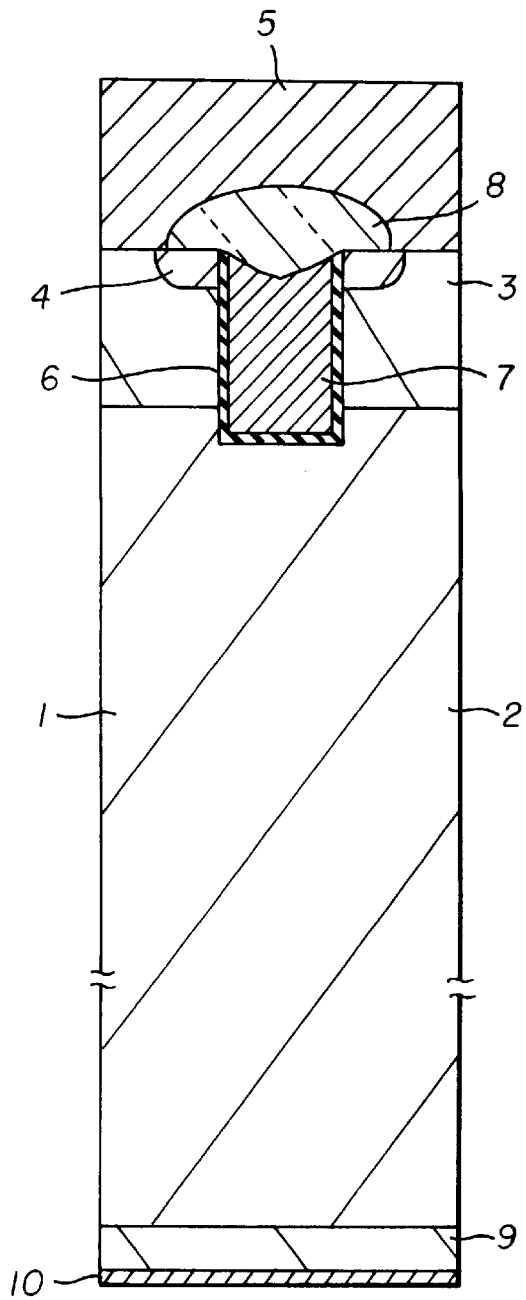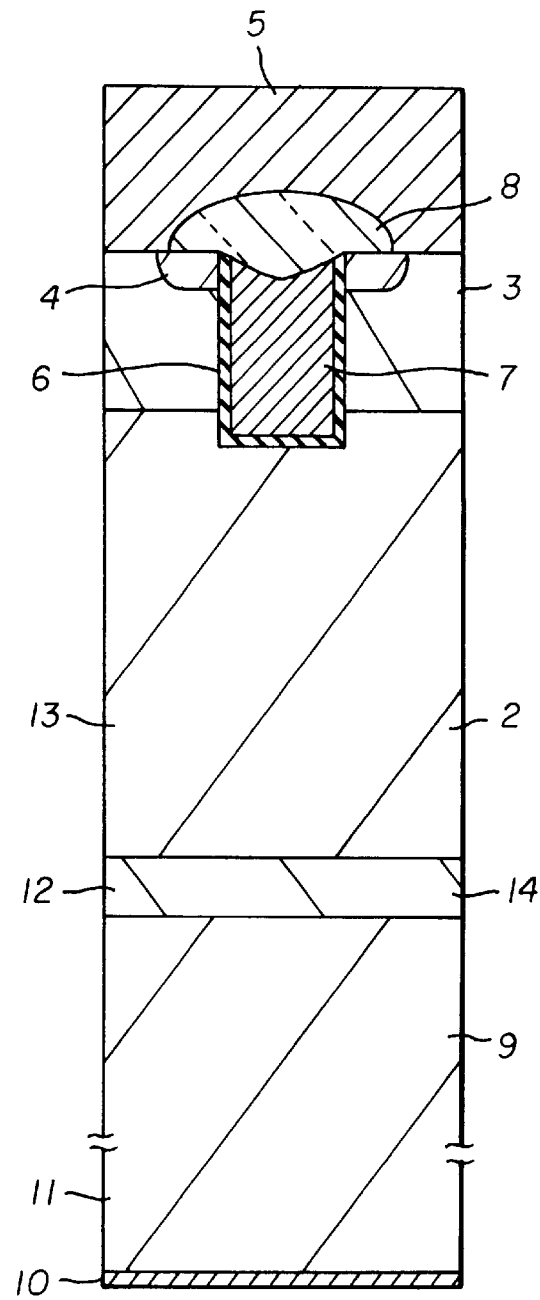
FIG. 27
(Prior Art)
FIG. 28
(Prior Art)

SEMICONDUCTOR DEVICE

FIELD OF THE INVENTION

The present invention relates to a semiconductor device and in particular, to a semiconductor device that constitutes an insulated gate bipolar transistor.

BACKGROUND

Insulated gate bipolar transistor (hereinafter referred to as IGBT), specifically devices which have planar gate structures as shown in FIG. 25 and FIG. 26 and devices which have trench gate structures as shown in FIG. 27 and FIG. 28, are known. A non-punch-through type IGBT as shown in FIG. 25 or FIG. 27 comprises a base layer 2 that is composed of an n-type semiconductor substrate made of for example an FZ wafer, a p-type channel diffusion region 3, an n-type emitter diffusion region 4, an emitter electrode 5, a gate-insulating film 6, a gate electrode 7, and an insulator film 8, which are formed on one surface side of the substrate, and a p-type collector layer 9 and a collector electrode 10, which are formed on a reverse surface side of the substrate.

A punch-through type IGBT as shown in FIG. 26 and FIG. 28 employs a wafer, that is an epitaxial wafer, and comprises a p-type wafer 11, an n-type semiconductor layer 12, and another n-type semiconductor layer 13 having the impurity concentration lower than that of the n-type semiconductor layer 12, the both n-type semiconductor layers being epitaxially grown on the p-type wafer 11. The body of the p-type wafer 11 constitutes a collector layer 9; the n-type semiconductor layer 12 on the collector layer constitutes a buffer layer 14; and the n-type semiconductor layer 13 on the buffer layer constitutes a base layer 2.

In the surface region on the side of the base layer 2 of the epitaxial wafer, formed are a p-type channel diffusion region 3, an n-type emitter diffusion region 4, an emitter electrode 5, a gate-insulating film 6, a gate electrode 7, and an insulator film 8. A collector electrode 10 is formed on the surface of the side of the collector layer 9, which is the reverse side of the epitaxial wafer.

However, the non-punch-through type IGBT mentioned above has a disadvantage of large loss because of the thick base layer 2, which is required so that the depletion layer in the turn-off operation does not extend beyond the thickness of the base layer 2. In the punch-through type IGBT that is also mentioned above, the thickness of the base layer 2 is about 120 $\mu$m for an example of a blocking voltage class of 1,200 V. The thickness value is smaller than the thickness of about 180 $\mu$m of the base layer of a non-punch-through type IGBT, which results in a lower loss of the punch-through type IGBT. However, the punch-through type IGBT has a disadvantage of its higher cost of the chip caused by the lower yield of the chip and the higher cost (over twice) of the epitaxial wafer than the FZ wafer.

In view of the foregoing, it would be desirable to provide a semiconductor device constituting an IGBT that can be produced with a high yield using an inexpensive wafer and generates little loss.

SUMMARY OF THE INVENTION

The present invention is directed to a semiconductor device, which constitutes an IGBT produced by using a wafer, for example a FZ wafer, that is cut from an ingot and having its surface polished and cleaned, wherein an n-type impurity diffusion layer having an enough dose to stop the electric field during turn-off is provided between a collector layer and a base layer as a semiconductor layer for stopping an electric field during turn-off operation (hereinafter this semiconductor layer is referred to as a field-stop layer).

The thickness of this field-stop layer defined by Xfs–Xj is from 0.5 $\mu$m to 3 $\mu$m, where Xfs is the position at which the impurity concentration in the field-stop layer becomes twice the impurity concentration of the base layer, and Xj is the position of the junction between the field-stop layer and the collector layer. One reason why the thickness of the field-stop layer, Xfs–Xj, is in the above indicated range is that when forming the field-stop layer by means of ion implantation, the maximum depth is 3 $\mu$m due to the energy limit of the ion implantation available for practical mass-production at present. On the other hand, the reason for the lower limit is that a diffusion layer thinner than the above-indicated lower limit is difficult to be formed by ion implantation with precise control.

The voltage at which the base layer depletes completely is appropriate to be 0.45 to 0.7 times blocking voltage of this IGBT. This is because when the depletion voltage is less than the lower limit, the spike voltage at the switching operation would be close to the blocking voltage and may cause failure of the IGBT and/or failure or malfunction of the system containing the IGBT. On the other hand, if the upper limit is exceeded, power loss reduction more than 20 percent can not be expected. Generally, a new product needs reduction in power loss over 20 percent in comparison with a conventional product so as to replace the conventional one.

The peak value of the impurity concentration in the collector layer is preferably larger than 15 times the peak value of the impurity concentration in the field-stop layer. If not larger than 15 times, the on-state voltage drop exceeds 3 V, which is not practical.

The impurity concentration at the junction position between the collector layer and the field-stop layer is preferably not less than $4 \times 10^{16}$ cm$^{-3}$. If less than $4 \times 10^{16}$ cm$^{-3}$, the blocking voltage is insufficient in the case the collector potential becomes lower than the emitter potential in the actual operation.

The average donor concentration in the field-stop layer is preferably not less than $1 \times 10^{15}$ cm$^{-3}$ and not less than 15 times the donor concentration of the base layer. In an IGBT, the base layer of which withstands 600 V, for example, the field-stop layer with donor concentration less than $1 \times 10^{15}$ cm$^{-3}$ cannot withstand 600 V because the depth Xfs–Xj of the filed-stopping layer formed by ion implantation is limited to 3 $\mu$m; that is, the IGBT cannot perform the blocking voltage of 1,200 V. The average donor concentration of the field-stop layer is not less than about 15 times the donor concentration of the base layer with resistivity of 60 $\Omega$cm, the latter concentration being $7 \times 10^{13}$ cm$^{-3}$.

Appropriate amount of dose to the field-stop layer is from $3 \times 10^{11}$ cm$^{-2}$ to $1 \times 10^{12}$ cm$^{-2}$. This is because the average donor concentration is not less than $1 \times 10^{15}$ cm$^{-3}$ and the dose of the field-stop layer having thickness Xfs–Xj of 3 $\mu$m is not less than $3 \times 10^{11}$ cm$^{-2}$. When the thickness Xfs–Xj of the field-stop layer is 0.5 $\mu$m, the field-stop layer with the average donor concentration of $2 \times 10^{16}$ cm$^{-3}$ may be supposed to withstand 600 V. The dose corresponding to this donor concentration is $1 \times 10^{12}$ cm$^{-2}$, which becomes an upper limit of the dose.

Advantageously, the voltage VA at which the field-stop layer and the base layer set up punch-through at 25° C. is larger than 1.54 times the voltage VB that is determined by the avalanche breakdown of the pn junction or smaller than 0.84 times the voltage VB. While a temperature range for performance guarantee of an IGBTs is generally from −20° C. to 150° C., if the ratio of VA to VB at 25° C. is in either of the above-specified ranges, VA and VB does not approach too close, as a result, failure of the IGBT hardly occurs in the whole temperature range from −20° C. to 150° C.

According to the present invention, an impurity diffusion layer that performs as a field-stop layer is formed in the region of one principal surface of a semiconductor substrate with the depth of not more than 3 μm, which is the maximum depth capable of implanting within the practical limit of ion implantation energy. Because this impurity diffusion region can be formed by means of an ion implantation, an IGBT can be produced with high yield using an inexpensive wafer such as an FZ wafer, same as in a non-punch-through type IGBT. Moreover, the field-stop layer allows the base layer to be as thin as that of the punch-through type IGBT, which achieves low loss.

BRIEF DESCRIPTION OF THE DRAWINGS

The invention will be described with reference to certain preferred embodiments thereof along with the accompanying drawings, wherein:

FIG. 14 is a cross-sectional view illustrating a structure at a stage during a manufacturing process of an IGBT having a structure as shown in FIG. 1;

FIG. 15 is a cross-sectional view illustrating a structure at a stage during a manufacturing process of an IGBT having a structure as shown in FIG. 1;

FIG. 16 is a cross-sectional view illustrating a structure at a stage during a manufacturing process of an IGBT having a structure as shown in FIG. 1;

FIG. 25 is a cross-sectional view of a conventional IGBT;

FIG. 26 is a cross-sectional view of another conventional IGBT;

FIG. 27 is a cross-sectional view of another conventional IGBT; and

FIG. 28 is a cross-sectional view of another conventional IGBT.

DETAILED DESCRIPTION OF THE PREFERRED EMBODIMENTS

Figure 1:
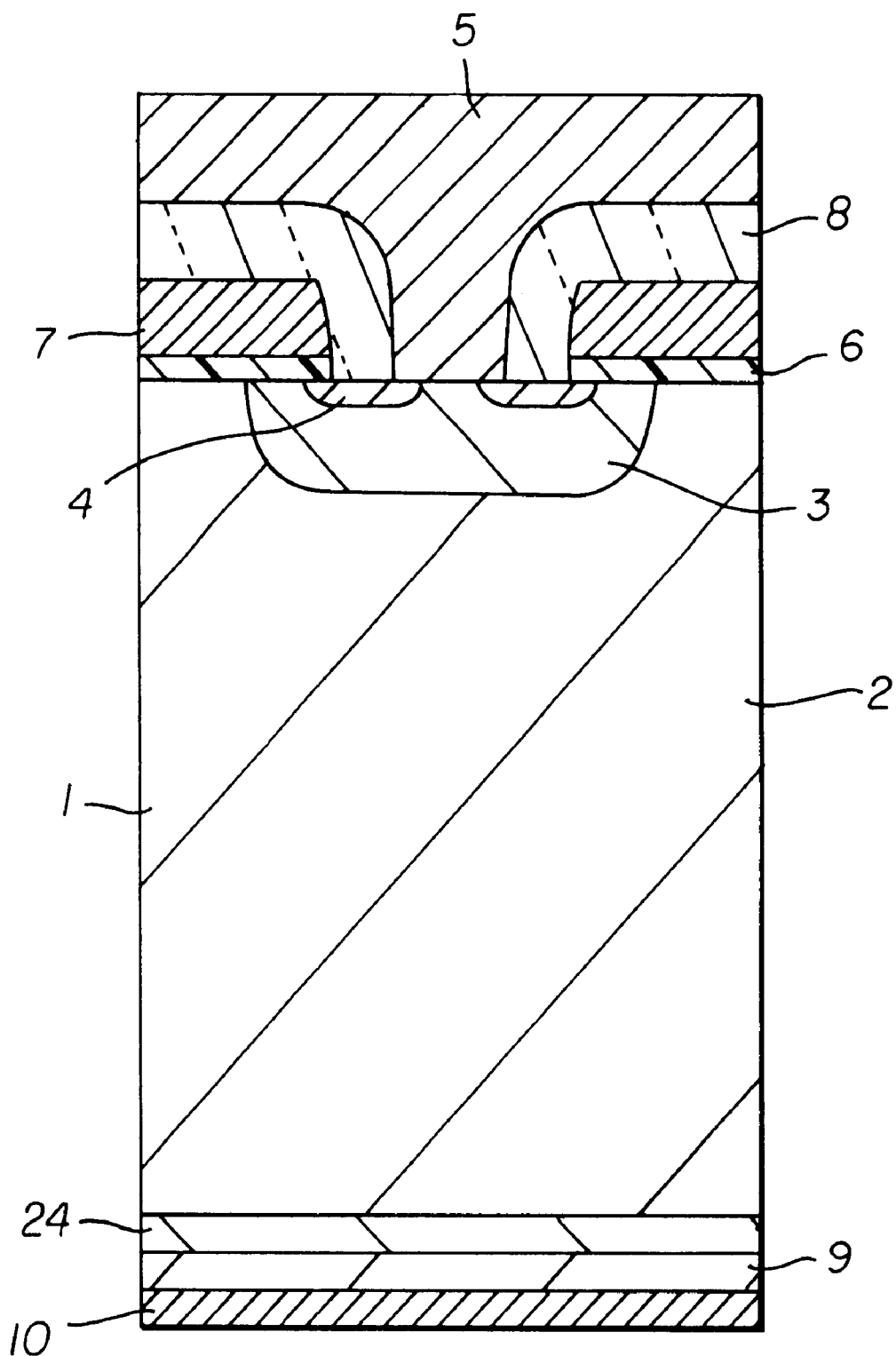
FIG. 1 is a cross-sectional view of an example of a semiconductor device according to the present invention.

FIG. 1 is a cross-sectional view of an example of a semiconductor device according to the present invention. This semiconductor device is an IGBT with a planar gate structure including a base layer 2 that is composed of an n-type semiconductor substrate 1 made of a single crystal silicon FZ wafer, for example. On the surface region of the base layer 2, a p-type channel diffusion region 3 is formed.

In this channel diffusion region 3, an n-type emitter diffusion region 4 is formed. On a part of this emitter diffusion region 4, a gate electrode 7 is formed through a gate-insulating film 6. An emitter electrode 5 is electrically connected to the channel diffusion layer 3 and the emitter diffusion region 4, and insulated from the gate electrode 7 through an insulator film 8. In a shallow portion of the reverse surface region of the base layer 2, a field-stop layer 24 composed of an n-type impurity diffusion layer is formed. A p-type collector layer 9 is formed in the portion of the reverse surface region shallower than the field-stop layer 24. A collector electrode 10 is formed on the collector layer 9.

Figure 2:
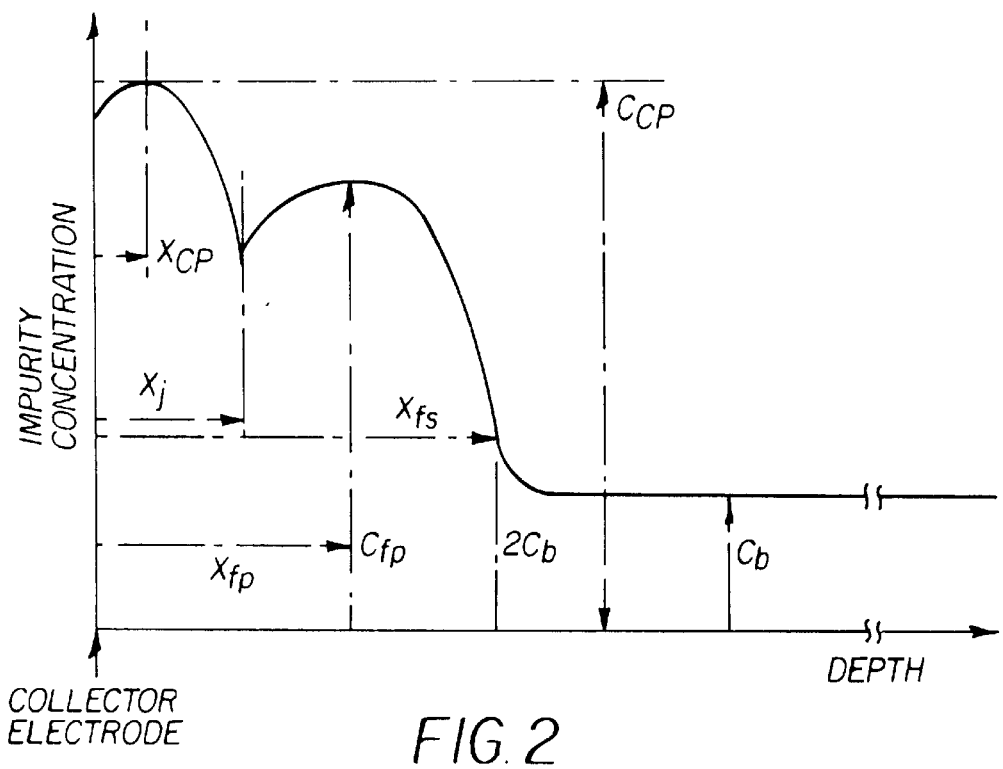
FIG. 2 is a chart showing an impurity profile near the collector layer of the IGBT illustrated in FIG. 1.

FIG. 2 shows an impurity profile near the collector layer 9 of the IGBT having the structure illustrated in FIG. 1. In FIG. 2, Cb, Ccp, and Cfp denote the impurity concentration in the base layer 2, the peak impurity concentration in the collector layer 9, and the peak impurity concentration in the field-stop layer 24, respectively. Xcp and Xfp are the depth at which the impurity concentration takes each maximum value in the collector layer 9 and the field-stop layer 24, respectively. Xfs represents the depth at which the impurity concentration in the field-stop layer 24 equals twice the impurity concentration Cb of the base layer 2. These depths are the distances from the boundary between the collector layer 9 and the collector electrode 10.

Xfs−Xj may be taken as a thickness of the field-stop layer 24 in the IGBT shown in FIG. 1. The value of this thickness ranges from 0.5 μm to 3 μm. While the field-stop layer 24 is formed by means of ion implantation in this aspect of embodiment, the maximum depth of the ion implantation is 3 μm because of the limitation of the practically available ion implantation energy. Therefore, ions can not be implanted into deeper region than the above-indicated upper limit.

On the other hand, the lower limit is based on the fact that a diffusion layer thinner than the above-indicated lower limit is practically infeasible to be formed by ion implantation with precise control. Nevertheless, if ion implantation equipment would be so improved that the ions could be implanted more deeply than the above upper limit or the diffusion layer could be formed more shallowly than the above lower limit with precise control, the range of the thickness of the field-stop layer may be extended beyond the above limitations corresponding to the technology development.

Resistivity of the semiconductor substrate or resistivity of the FZ wafer is uniform in the thickness direction and has a value of 60 Ωcm, for example. Here, "uniform" in the thickness direction means that variation of the resistivity is within ±20% in the thickness direction of the wafer. The wafer used in the invention may not be an FZ wafer so long as the variation of resistivity in the thickness direction of the wafer is within ±20%. If the resistivity of the wafer is 60 Ωcm, the resistivity of the base layer 2 is 60 Ωcm. The thickness of the base layer 2 is about 120 μm for an IGBT of blocking voltage of 1,200 V. Because the field-stop layer 24 stops the depletion layer that emerges in the base layer 2 during turn-off just like a buffer layer of a conventional punch-through type IGBT, the thickness of the base layer only needs to be nearly equal to the thickness of the base layer of the conventional punch-through type IGBT.

Figure 3:
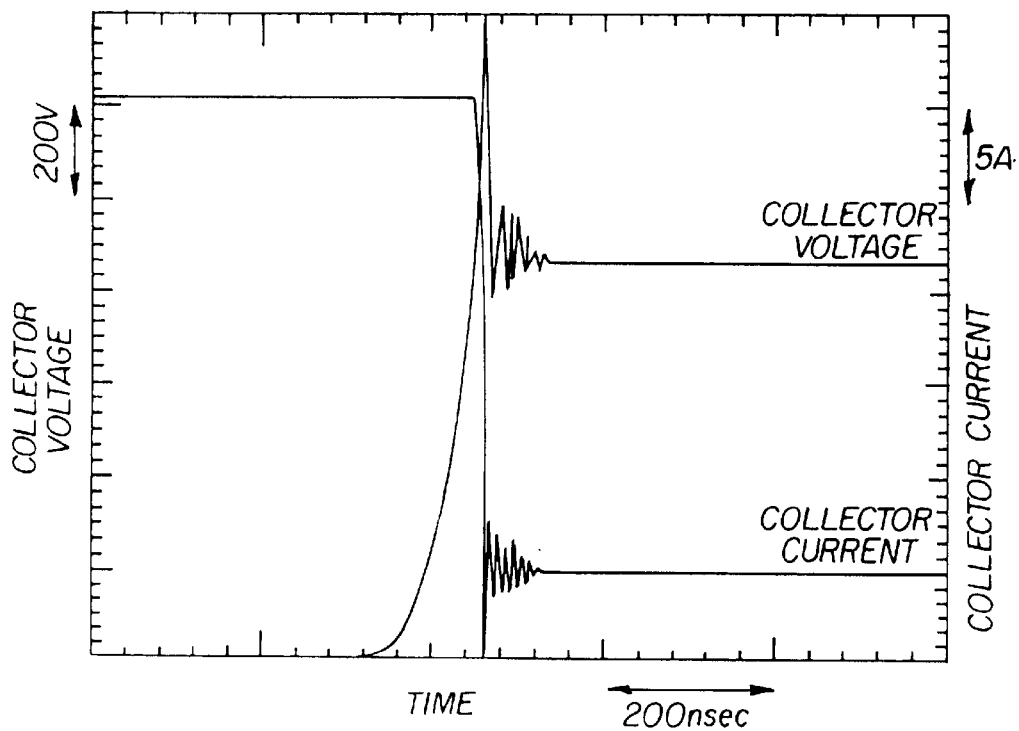
FIG. 3 is a chart showing a waveform of the oscillation in the collector current and the voltage between collector and emitter in the turn-off operation of an IGBT provided with a field-stop layer but having thin base layer.

The voltage Vpt at which the base layer 2 depletes completely is appropriate to be in the range from 0.45 to 0.7 times the blocking voltage BVce of the IGBT. The reason is as follows. If the base layer 2 is thin in the IGBT having a field-stop layer 24, the stored carriers in the base layer 2 will be exhausted in the turn-off operation at a high collector voltage, causing oscillation in current and voltage as shown in FIG. 3.

This oscillation in current and voltage not merely generates switching noises, but may also cause failure or malfunction of the system due to the overvoltage, so must be suppressed to as low as possible. A steady-state value of the collector voltage is about 600 V in an inverter employing IGBT of the blocking voltage class of 1,200 V, for example. However, the collector voltage may rise to 800 V in a special operating condition.

Figure 4:
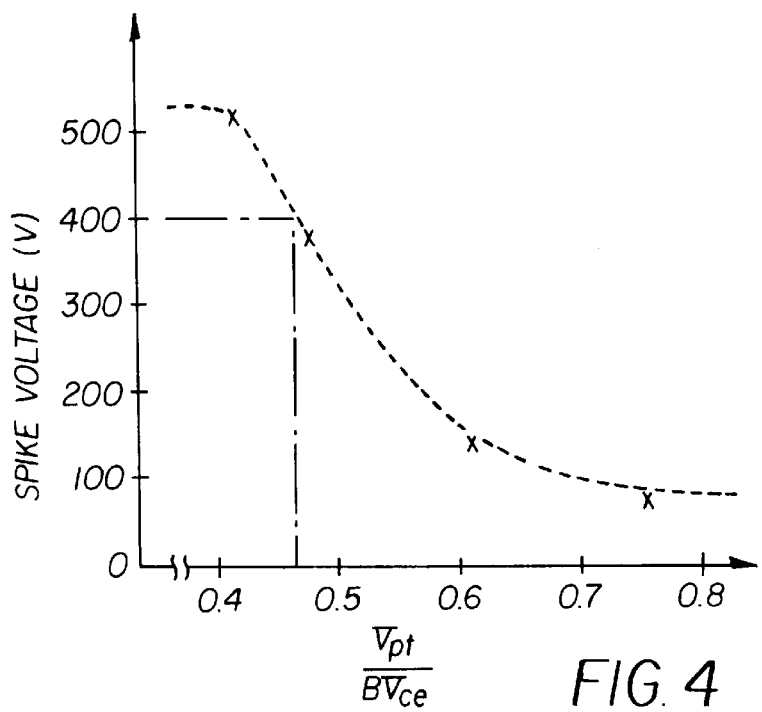
FIG. 4 is a chart showing the relationship between the spike voltage in the switching operation at 800 V and the thickness of the base layer in an IGBT of blocking voltage of 1,200 V.

FIG. 4 shows the dependency of a spike voltage in a switching operation at Vcc=800 V on the thickness of the base layer 2 of an IGBT of blocking voltage of 1,200 V. Here, the thickness of the base layer 2 is represented in terms of Vpt/BVce because Vpt, which is the voltage the base layer depletes completely, increases with increase of the base layer thickness. BVce is the blocking voltage of the IGBT. The spike voltage is desired not to exceed 400 V taking into account that the collector voltage possibly rises to 800 V.

Accordingly, Vpt/BVce needs to be not smaller than 0.45 seeing FIG. 4, that is, Vpt is equal to or greater than 0.45 times BVce. As for the upper limit of the Vpt/BVce, although any special limitation need not be imposed from the view point of suppressing the spike voltage, large Vpt corresponds to thick base layer 2, resulting in large losses. In order to achieve loss reduction over 20% as compared with the loss of a conventional non-punch-through type IGBT, Vpt/BVce is appropriate to be not larger than 0.7. The above reasoning is applicable to IGBTs other than the blocking voltage class of 1,200 V. Therefore, the voltage Vpt, at which the base layer 2 depletes completely, is appropriate to be in the range from 0.45 to 0.7 times the blocking voltage BVce.

Figure 5:
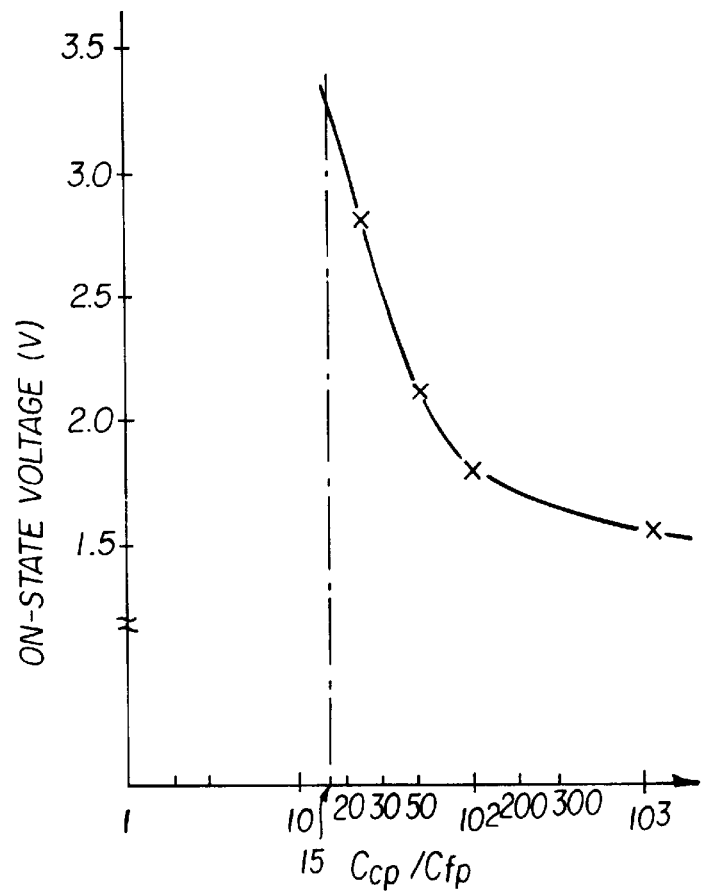
FIG. 5 is a chart showing the dependency of the on-state voltage on the Ccp/Cfp of an IGBT.

The peak value of the impurity concentration Ccp of the collector layer 9 is preferably larger than 15 times the peak value of the impurity concentration Cfp of the field-stop layer 24. The reason is described below. FIG. 5 shows the dependency of the on-state voltage on the Ccp/Cfp of an IGBT. As shown in FIG. 5, when the Ccp/Cfp value decreases from 100, the on-state voltage rapidly increases due to deficiency of minority carrier injection and exceeds 3 V at Ccp/Cfp value of 15.

Because on-state voltage over 3 V is generally impractical, an IGBT having Ccp/Cfp value not greater than 15 is impractical. The average donor concentration in the field-stop layer 24 is not less than $1 \times 10^{15}$ cm$^{-3}$ as described later. The peak impurity concentration Ccp of the collector layer 9 is generally at most about $1 \times 10^{19}$ cm$^{-3}$, which determines the upper limit of the Ccp/Cfp value. However, the upper limit value itself is not important because the on-state voltage approaches a certain limiting value as the Ccp/Cfp value increases.

The impurity concentration is preferably not less than $4 \times 10^{16}$ cm$^{-3}$ at the junction position Xj between the collector layer 9 and the field-stop layer 24. The reason is in the following. In an IGBT, the collector is usually at positive and higher electrical potential than the emitter. However, a reverse-biased voltage is occasionally applied in an actual operation of an inverter, for example. Accordingly, a reverse blocking voltage of at least 20 V is required. The reverse blocking voltage of an IGBT is determined depending on the impurity concentration at the position Xj.

Figure 6:
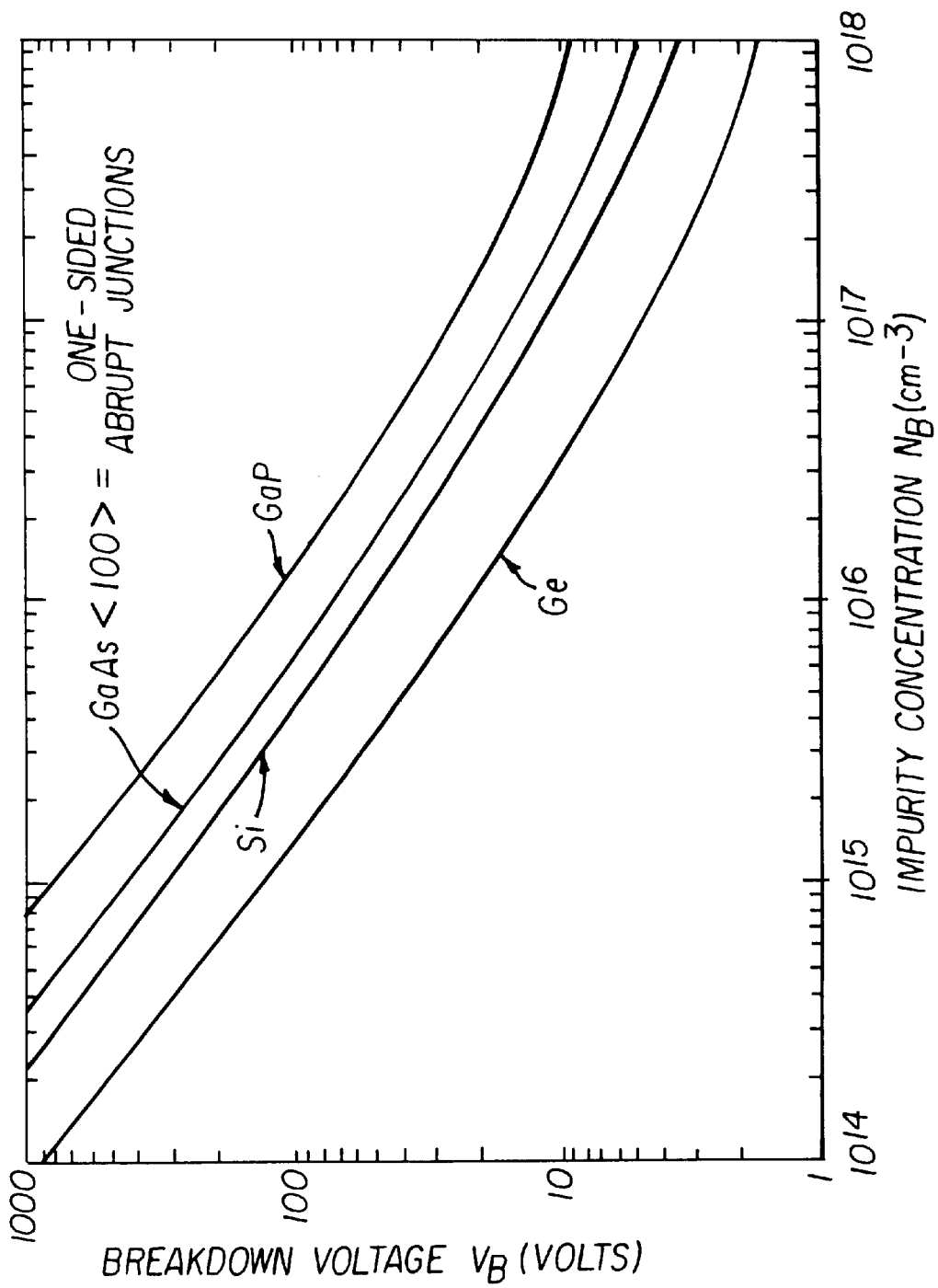
FIG. 6 is a chart showing the relationship between impurity concentration and breakdown voltage at a pn junction.

The impurity concentration at a pn junction of $4 \times 10^{16}$ cm$^{-3}$ is required for the pn junction to exhibit a reverse blocking voltage of not less than 20 V, as is known from the chart of FIG. 6, which shows the relationship between the impurity concentration and the breakdown voltage. The chart is quoted from a book by S. M. Sze: "Physics of Semiconductor Devices", 2nd edition, John Wiley & Sons, Inc., p. 101 (1981).

Figure 7:
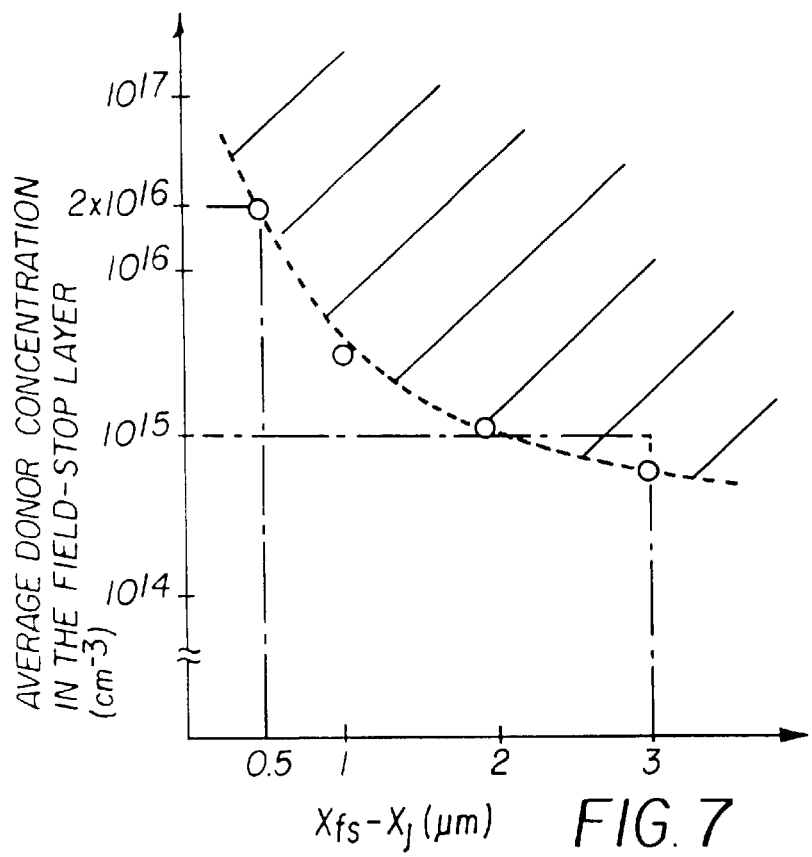
FIG. 7 is a chart showing the relation between average donor concentration of a field-stop layer and thickness of the layer.

The donor concentration in the field-stop layer is preferably not less than $1 \times 10^{15}$ cm$^{-3}$. The reason is in the following. FIG. 7 shows the dependency of the average donor concentration of a field-stop layer on the thickness of the layer. The chart is applicable to such an IGBT that the base layer thereof is 120 μm thick and withstands 600 V, and the relationship is derived from a simulation of the critical values for the field-stop layer to withstand 600 V.

The hatched area that is the upper-right side portion of the dotted line indicates the region in which the field-stop layer 24 withstands 600 V. In that region, the field-stop layer is thicker, i.e., larger (Xfs−Xj), and has higher impurity concentration. The IGBT as a whole withstands 1,200 V in this hatched area. As mentioned earlier, the practical limit of the depth Xfs–Xj is 3 μm in the process of forming the field-stop layer 24 by means of ion implantation due to the limitation of ion-implanting energy at present. Consequently, for an IGBT of blocking voltage of 1,200 V class, it is known from FIG. 7 that the average donor concentration of the field-stop layer 24 needs to be not less than $1 \times 10^{15}$ cm$^{-3}$.

The average donor concentration of the field-stop layer corresponds to about 15 times or more of the donor concentration, $7 \times 10^{13}$ cm$^{-3}$, of the base layer 2 with resistivity of 60 Ωcm. Accordingly, the average donor concentration of the field-stop layer 24 is preferably 15 or more times the donor concentration of the base layer 2. For IGBT, in which the blocking voltage is less than 1,200 V, for example 600 V or 900 V, the average donor concentration of the field-stop layer 24 and its ratio to the average donor concentration of the base layer becomes lower than those values of the 1,200 V IGBT. For IGBTs having blocking voltage of greater than 1,200 V, for example 1,400 V, 1,800 V, or 2,000 V, the average donor concentration of the field-stop layer 24 and its ratio to the average donor concentration of the base layer becomes higher than those of the 1,200 V IGBT.

The dose for the field-stop layer 24 is preferably in the range from $3 \times 10^{11}$ cm$^{-2}$ to $1 \times 10^{12}$ cm$^{-2}$. The lower limit of the dose is obtained from the thickness of 3μm and the average donor concentration of $1 \times 10^{12}$ cm$^{-3}$ of the field-stop layer 24 by the calculation: $1 \times 10^{15}$ cm$^{-3} \times 3 \times 10^{-4}$ cm=$3 \times 10^{11}$ cm$^{-2}$.

As is known from FIG. 7, in the case the thickness Xfs–Xj of the field-stop layer 24 is 0.5 μm, the layer withstands 600 V if the average donor concentration of the layer is $2 \times 10^{16}$ cm$^{-3}$. Therefore, the above mentioned upper limit of the dose is obtained by the calculation:

$2 \times 10^{16}$ cm$^{-3} \times 0.5 \times 10^{-4}$ cm=$1 \times 10^{12}$ cm$^{-2}$.

Figure 8:
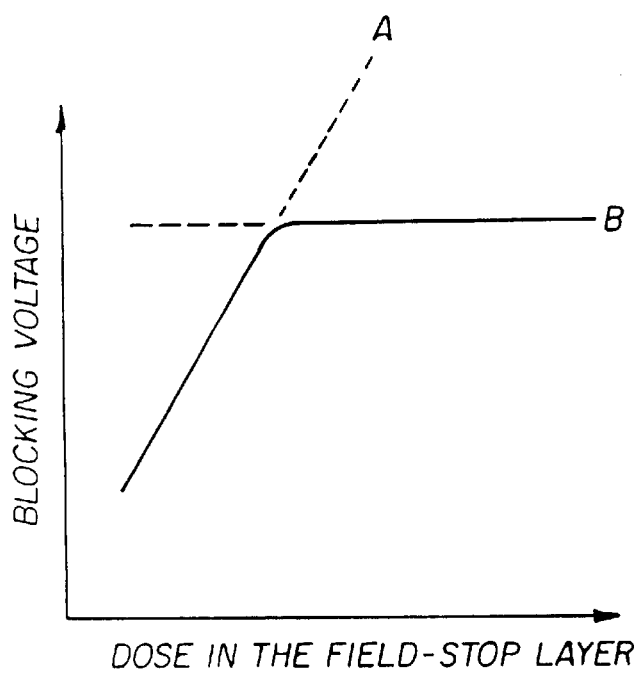
FIG. 8 is a chart showing a relationship between dose in a field-stop layer and a blocking voltage of an IGBT.

The voltage VA at which the field-stop layer 24 and the base layer 2 set up punch-through at 25° C. is preferably not smaller than 1.54 times the voltage VB determined by avalanche breakdown at the pn junction, or not larger than 0.84 times the latter voltage VB, so as to prevent the IGBT from failure. The reason is described in the following. FIG. 8 shows the dependency of the blocking voltage on the dose in the field-stop layer 24 in an IGBT having s structure as shown in FIG. 1.

Figure 9:
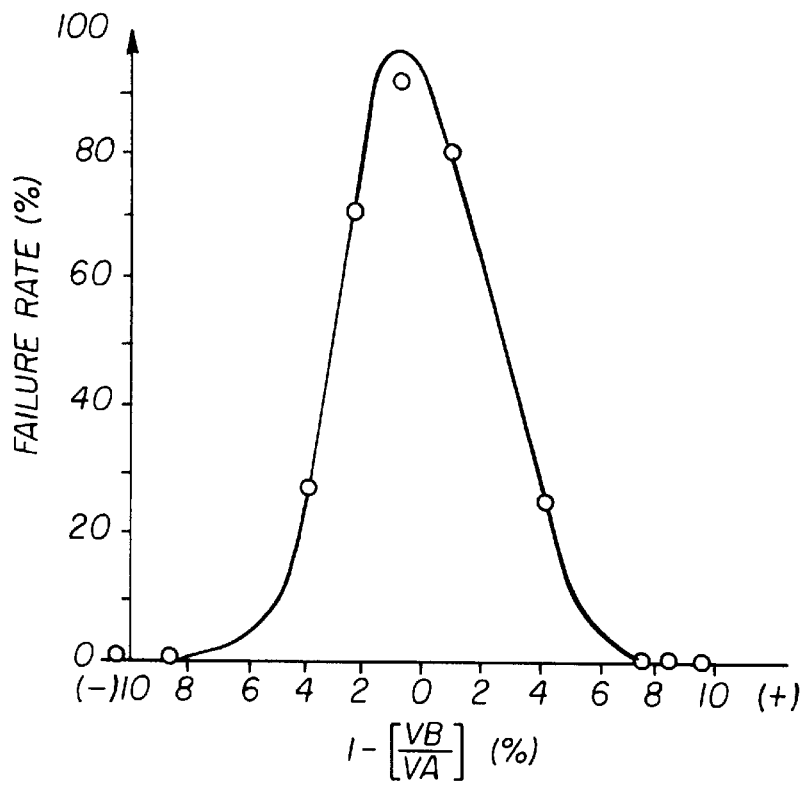
FIG. 9 is a chart showing dependency of failure rate of an IGBT on the ratio VA/VB, where VA is a blocking voltage in a punch-through mode and VB is a blocking voltage in an avalanche breakdown mode.

There are two modes for an IGBT of FIG. 1 to determine its blocking voltage: a mode in which the base layer 2 and the field-stop layer 24 set up punch-through—line A in FIG. 8, and a mode in which the pn junction set up avalanche breakdown—line B in FIG. 9. The blocking voltage in the punch-through mode is determined by the dose of the field-stop layer and the concentration and the thickness of the base layer 2. The dose depends on the concentration and the depth of the field-stop layer. The blocking voltage in the avalanche breakdown mode is determined by the concentration and the width of the base layer 2 and the surface structure. The actual value of the blocking voltage is determined by the smaller of the blocking voltage in the punch-through mode and the blocking voltage in the avalanche breakdown mode as shown in FIG. 8.

Meanwhile, in the region in which the two modes coexist, that is, in the neighborhood of the intersection of the A line and the B line in FIG. 8, the avalanche breakdown voltage of the IGBT is very small. When a pnp transistor composing the IGBT is in the state just before punch-through, the base region of the pnp transistor is extremely narrow. The minority carriers generated by impact ionization at around the silicon surface in the punch-through mode make up base current and turns-on a local transistor, causing current concentration, which brings about failure of the IGBT.

The experiments by the inventors of the present invention have shown that a difference must be not smaller than ±5% between a blocking voltage in the punch-through mode VA and a blocking voltage in the avalanche breakdown mode VB for preventing the above-described phenomenon leading to failure. A short description about the experiments will be given below. A multiple of IGBTs having a structure as shown in FIG. 1 were manufactured having various values of blocking voltage in punch-through mode VA and blocking voltage in avalanche breakdown mode VB. Failure rates were obtained for these IGBTs. The results are shown in FIG. 9. As is apparent from FIG. 9, the failure rate is insignificant if the difference is not smaller than ±5% between the blocking voltage in the punch-through mode VA and the blocking voltage in the avalanche breakdown mode VB.

Figure 10:
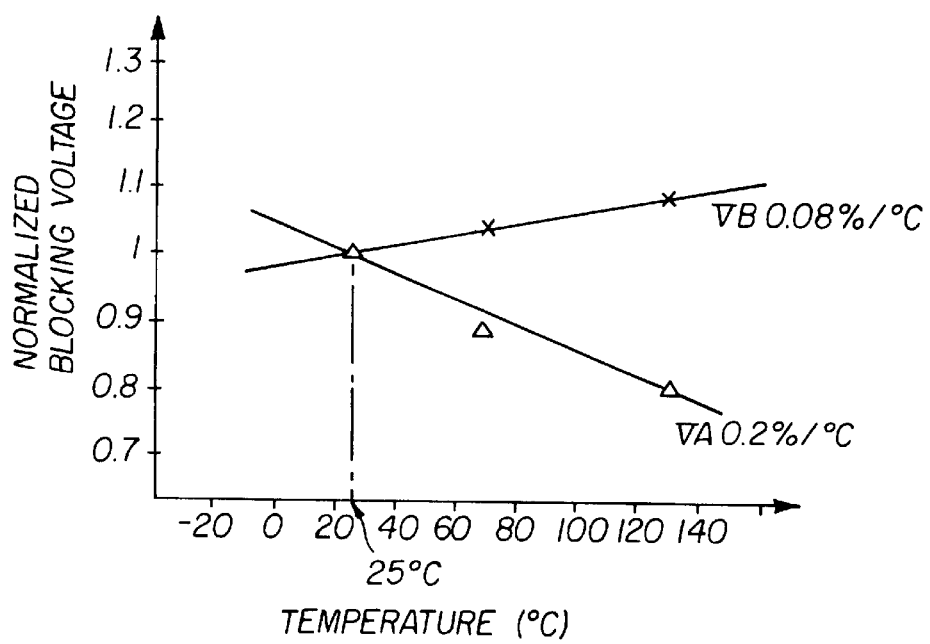
FIG. 10 is a chart showing a temperature dependence of a blocking voltage VA in a punch-through mode and a temperature dependence of a blocking voltage VB in an avalanche breakdown mode.

The inventors further have studied the temperature dependence of the blocking voltages VA and VB. The results are shown in FIG. 10. FIG. 10 shows that the coefficient of temperature dependence of blocking voltage is negative for VA in punch-through mode. That means the blocking voltage VA decreases at higher temperature. The rate of the decrease is 0.2 percent per degree centigrade.

On the other hand, the temperature coefficient of the blocking voltage in the avalanche breakdown mode VB is positive, which means the blocking voltage VB decreases with decrease of temperature. The rate of temperature variation is 0.08 percent per degree centigrade. Based on the above data, the condition can be obtained for an IGBT to avoid failure in the whole temperature range from –20 to 150° C., which is a common temperature range for guarantee of operation performance of an IGBT. In case the blocking voltage VA in the punch-through mode is larger than the blocking voltage VB in the avalanche breakdown mode at 25° C., the VA and the VB comes close at higher temperature. So the condition for avoiding failure in the whole temperature range from –20 to 150° C. is that the VA is larger than the VB at 150° C. by 5% or more:

$VA(150°$ C.$)/VB(150°$ C.$)=1.05$

Left hand side=$-VA(25°$ C.$) \times [1-0.002 \times (150-25)]/\{VB(25°$ C.$) \times [1+0.0008 \times (150-25)]\}$ Hence, $VA(25°$ C.$)=1.54 \times VB(25°$ C.$)$ This indicates that, if the blocking voltage VA in the punch-through mode is not smaller than 1.54 times the blocking voltage VB in the avalanche breakdown mode at 25° C., the VA is greater than the VB by 5% or more in the whole temperature range from –20 to 150° C., thus failure can be avoided. Similarly, the condition can be obtained for the case the blocking voltage VA in the punch-through mode is smaller than the blocking voltage VB in the avalanche breakdown mode at 25° C. In that case, the VA and the VB comes close at lower temperature. So, the condition for avoiding failure in the whole temperature range from –20 to 150° C. is that the VA is smaller than the VB at –20° C. by 5% or more:

$VA(-20°$ C.$)/VB(-20°$ C.$)=0.95$

Left hand side=$VA(25°$ C.$) \times [1-0.002 \times (-20-25)]/\{VB(25°$ C.$) \times [1+0.0008 \times (-20-25)]\}$ Hence, $$VA(25° C.)=0.84\times VB(25° C.)$$

This indicates that, if the blocking voltage VA in the punch-through mode is not larger than 0.84 times the blocking voltage VB in the avalanche breakdown mode at 25° C., the VA is less than VB by 5% or more in the whole temperature range from −20° C. to 150° C., thus failure can be avoided.

Figure 11:
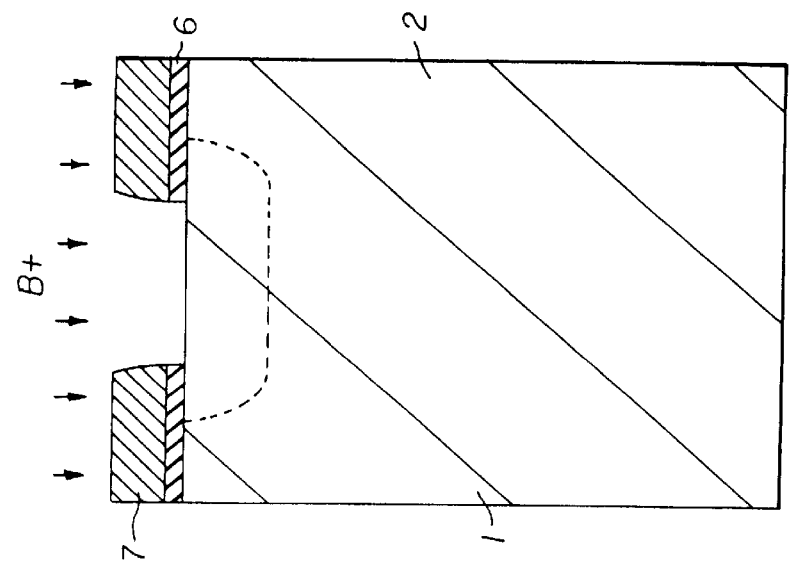
FIG. 11 is a cross-sectional view illustrating a structure at a stage during a manufacturing process of an IGBT having a structure as shown in FIG. 1.

A manufacturing process of a specific example of an IGBT having structure as shown in FIG. 1 will now be described with reference to FIGS. 11 through 16. First, a gate-insulating film 6 is formed on one principal surface of a semiconductor substrate 1 composed of an FZ wafer having resistivity of 60 Ωcm, for example. On the gate-insulating film 6, polycrystalline silicon is deposited for forming a gate electrode. A window is opened in the region corresponding to a channel diffusion region 3 in the gate-insulating film 6 and the gate electrode 7 by photolithography and etching, and boron ions are implanted there. The cross-sectional structure at this stage is shown in FIG. 11.

Figure 13:
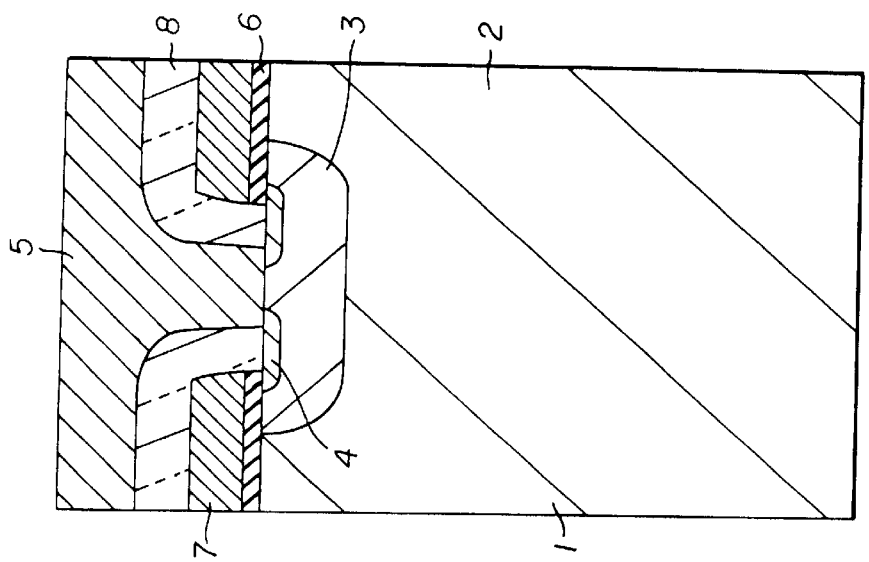
FIG. 13 is a cross-sectional view illustrating a structure at a stage during a manufacturing process of an IGBT having a structure as shown in FIG. 1.
Figure 12:
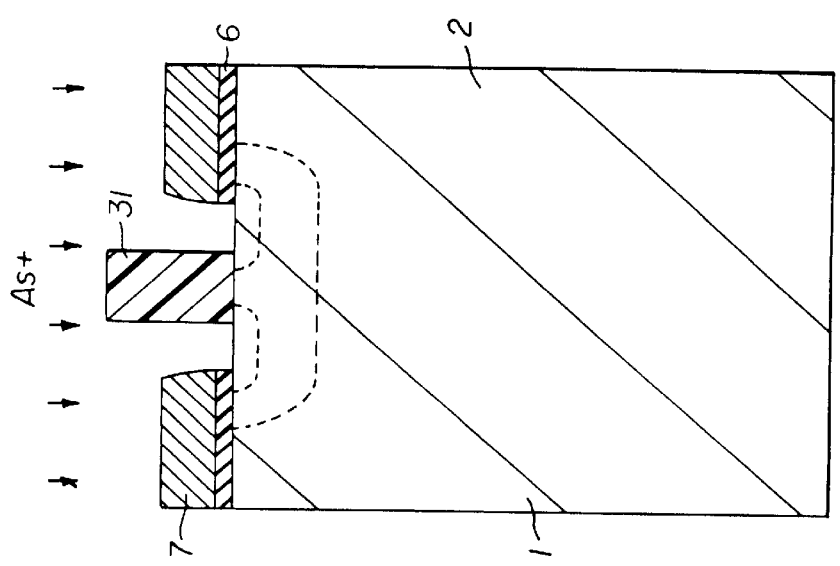
FIG. 12 is a cross-sectional view illustrating a structure at a stage during a manufacturing process of an IGBT having a structure as shown in FIG. 1.

Subsequently, by patterning a photoresist, a portion of the photoresist 31 is remained in the central portion of the window corresponding to the channel diffusion region 3. Using the photoresist 31 as a mask, arsenic ions are implanted into the channel diffusion region 3. The cross-sectional structure at this stage is shown in FIG. 12. After removing the photoresist 31, heat treatment is conducted to recover from the damage caused by the ion implantation and to activate the implanted ions, resulting in formation of the channel diffusion region 3 and an emitter diffusion region 4. An insulator film 8 is then laminated. By etching the insulator film 8, a portion of the channel diffusion region 3 and a portion of the emitter diffusion region 4 are exposed. An emitter electrode 5 of aluminum, for example, is then deposited. The cross-sectional structure at this stage is shown in FIG. 13.

The resulted wafer is ground and polished from the other principal surface of the substrate 1 to wear down to the thickness of 120 μm. To the polished surface, phosphorus ions are implanted to form a field-stop layer 24. The dose is about $5\times10^{12}$ cm$^{-2}$. The cross-sectional structure at this stage is shown in FIG. 14. Because the rate of activated phosphorus at the heat treatment temperature of 400° C. is about 10%, electrically active phosphorus ions are about $5\times10^{11}$ cm$^{-2}$ out of the implanted $5\times10^{12}$ cm$^{-2}$. Subsequently, boron ions are implanted to form a collector layer 9 with the dose of $1\times10^{15}$ cm$^{-2}$. A cross-sectional structure at this stage is shown in FIG. 15.

After that, heat treatment at about 400° C. is conducted to recover from the damage caused by the ion implantation and to activate the implanted ions, resulting in formation of the field-stop layer 24 and a collector layer 9. Depositing a collector electrode 10 on the surface of the collector 9 by sputtering, for example, an IGBT of the structure of FIG. 1 is manufactured. A part of the collector electrode that contacts with the collector layer 9 is composed of aluminum or platinum, for example.

Figure 17:
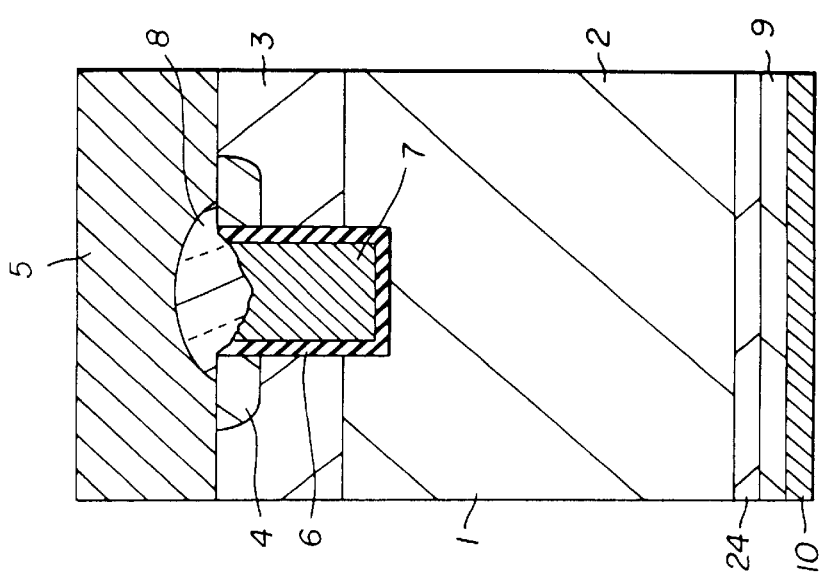
FIG. 17 is a cross-sectional view of another example of a semiconductor device according to the present invention.

FIG. 17 is a cross-sectional view of another example of a semiconductor device according to the present invention. This semiconductor device is an IGBT having a trench gate structure. The base layer 2 is composed of an n-type semiconductor substrate 1 made of a silicon FZ wafer. On a surface of the base layer 2, a p-type channel diffusion region 3 is formed. In the channel diffusion region 3, an n-type emitter diffusion region 4 is formed. In the central portion of the channel diffusion region 3, a trench is formed through the emitter diffusion region 4. A gate electrode 7 is formed in this trench through a gate-insulating film 6 that coats inner surface of the trench.

An emitter electrode 5 is electrically connected to the channel diffusion region 3 and the emitter diffusion region 4, and insulated from the gate electrode 7 through an insulator film 8. In a shallow portion of the reverse surface region of the base layer 2, a field-stop layer 24 is formed. A p-type collector layer 9 is formed in the portion of the reverse surface region shallower than the field-stop layer 24. A collector electrode 10 is formed on the collector layer 9.

The IGBT shown in FIG. 17 is different from the IGBT shown in FIG. 1 only in that the IGBT in FIG. 17 has trench gate structure while the IGBT in FIG. 1 has a planar gate structure. Thus, in the IGBT of FIG. 17, the thickness Xfs–Xj of the field-stop layer 24 is from 0.5 μm to 3 μm. Likewise, the voltage at which the base layer 2 depletes completely is 0.45 to 0.7 times the blocking voltage of the IGBT. The peak value of the impurity concentration Ccp in the collector layer 9 is not smaller than 15 times the peak value of the impurity concentration Cfp of the field-stop layer 24.

The donor concentration at the junction position between the collector layer 9 and the field-stop layer 24 is not smaller than $4\times10^{16}$ cm$^{-3}$. The average donor concentration in the field-stop layer 24 is not smaller than $1\times10^{15}$ cm$^{-3}$ and is not smaller than 15 times the donor concentration in the base layer 2. The dose into the field-stop layer is in the range from $3\times10^{11}$ cm$^{-2}$ to $1\times10^{12}$ cm$^{-2}$. Finally, the voltage at which the field-stop layer 24 and the base layer 2 set up punch-through at 25° C. is either higher than 1.54 times the voltage determined by avalanche breakdown at the pn junction or lower than 0.84 times the latter voltage. The reasons for these numerical limitations are same as the reasons described about the IGBT of FIG. 1 with reference to FIG. 2 through FIG. 10.

Figure 18:
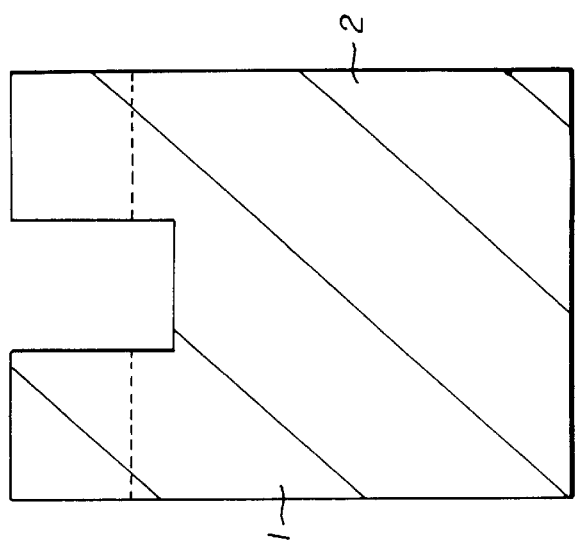
FIG. 18 is a cross-sectional view illustrating a structure at a stage during a manufacturing process of an IGBT as shown in FIG. 17.

A manufacturing process of an IGBT having a structure as shown in FIG. 17 will now be described referring to FIGS. 18 through 23. First, boron ions for forming a channel diffusion region 3 are implanted into one principal surface of a semiconductor substrate 1 composed of an FZ wafer having resistivity of 60 ?cm, for example. A trench is then formed by photolithography and etching. The cross-sectional structure at this stage is shown in FIG. 18. Then, a gate-insulating film 6 is deposited. On this insulating film, polycrystalline silicon is deposited for forming a gate electrode 7. The gate-insulating film and the polycrystalline silicon outside of the trench are removed, leaving the gate-insulating film 6 and the gate electrode 7 in the trench.

Figure 19:
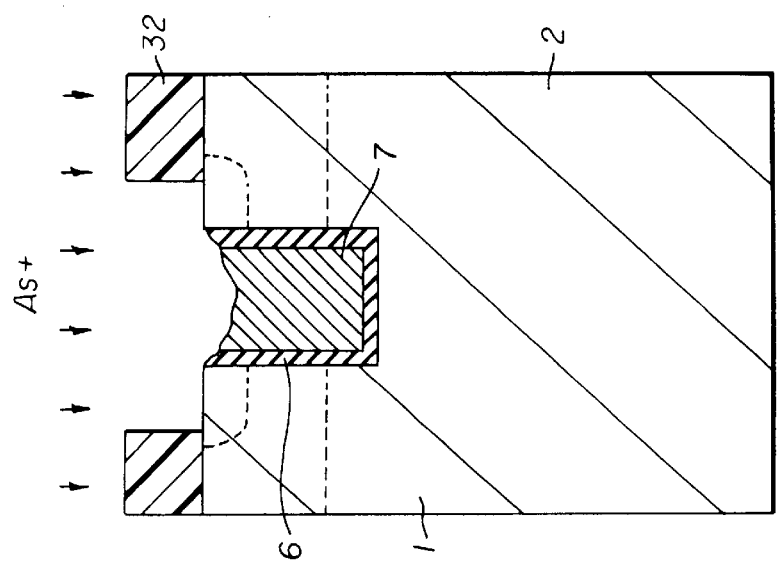
FIG. 19 is a cross-sectional view illustrating a structure at a stage during a manufacturing process of an IGBT as shown in FIG. 17.
Figure 20:
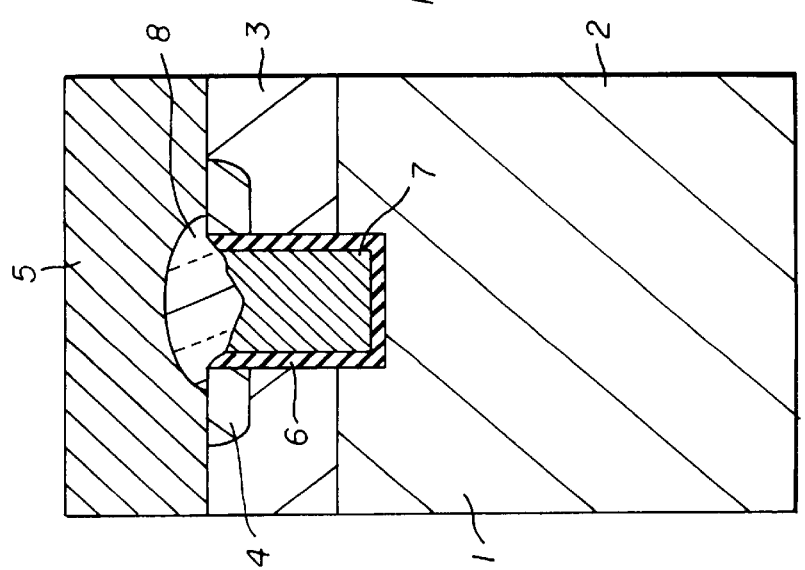
FIG. 20 is a cross-sectional view illustrating a structure at a stage during a manufacturing process of an IGBT having a structure as shown in FIG. 17.

Then, photoresist is applied and, by patterning, windows are opened in the regions corresponding to the emitter diffusion region 4. Arsenic ions are implanted into the channel diffusion region 3 using the remained resist 32 as a mask. The cross-section at this stage is shown in FIG. 19. After removing the photoresist 32, heat treatment is conducted to recover from the damage caused by the ion implantation and to activate the implanted ions, resulting in formation of the channel diffusion region 3 and the emitter diffusion region 4. An insulator film 8 is then formed. By partially etching the insulator film 8, the channel diffusion region 3 and a portion of the emitter diffusion region 4 are exposed while the gate electrode 7 is covered. An emitter electrode 5 is then deposited thereon. The cross-section at this stage is shown in FIG. 20.

The manufacturing process after this step is same as for the IGBT having planar gate structure described earlier.

Figure 22:
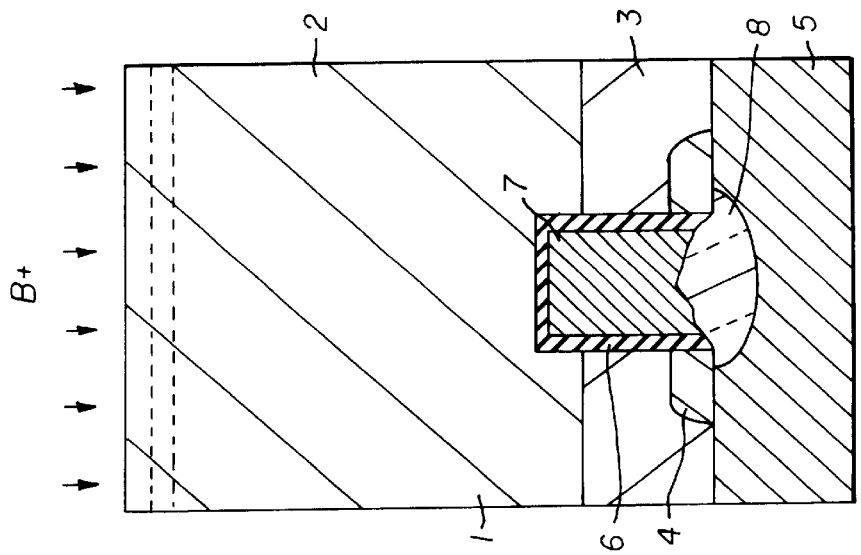
FIG. 22 is a cross-sectional view illustrating a structure at a stage during a manufacturing process of an IGBT having a structure as shown in FIG. 17.
Figure 21:
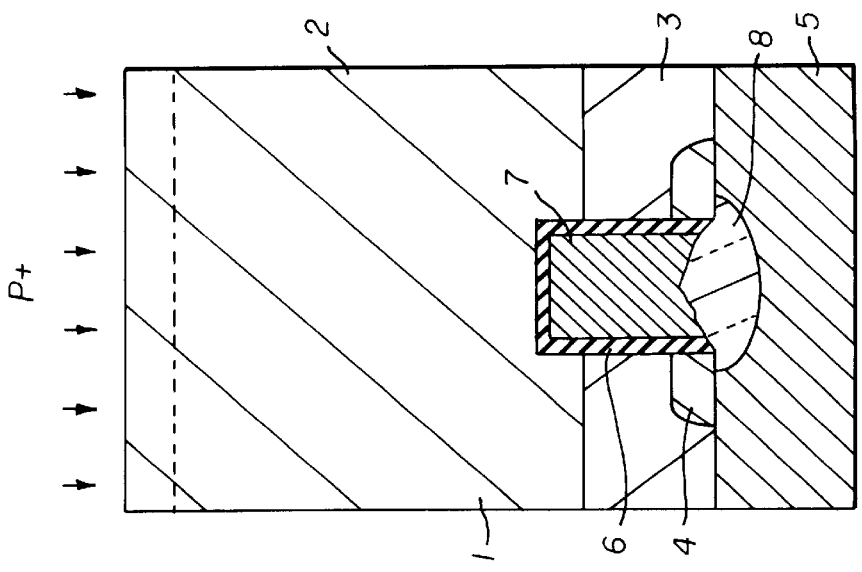
FIG. 21 is a cross-sectional view illustrating a structure at a stage during a manufacturing process of an IGBT having a structure as shown in FIG. 17.
Figure 23:
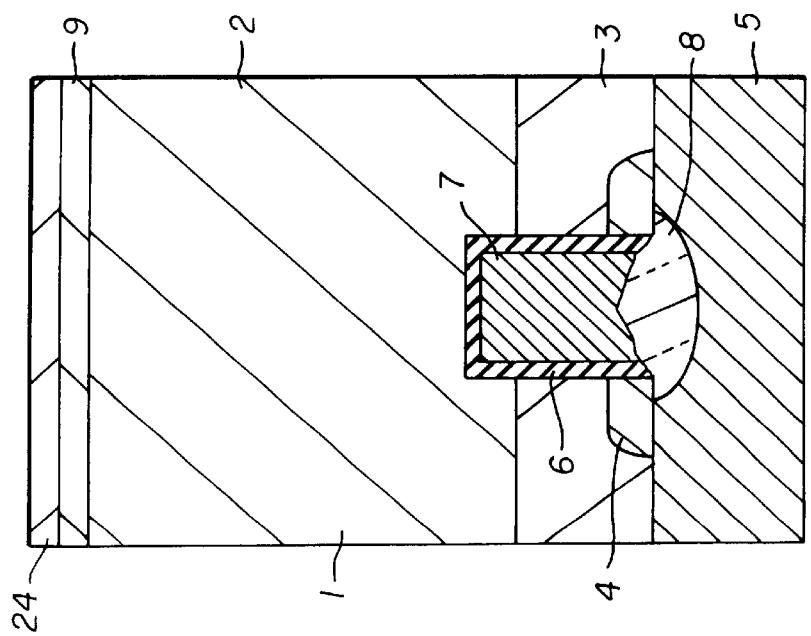
FIG. 23 is a cross-sectional view illustrating a structure at a stage during a manufacturing process of an IGBT having a structure as shown in FIG. 17.

Namely, after polishing the wafer to the thickness of 120 μm, phosphorus ions for forming a field-stop layer 24 are implanted. Subsequently, boron ions for forming a collector layer 9 are implanted as shown in FIG. 22. After that, heat treatment is conducted for forming a field-stop layer 24 and a collector layer 9 as shown in FIG. 23. Finally, a collector electrode 10 is deposited on the collector layer 9, to complete an IGBT having a structure as shown in FIG. 17.

In the above-described aspects of embodiments of the invention, the field-stop layer 24 is formed in a principal surface region of a semiconductor substrate with the depth not greater than 3 μm that is the maximum depth practically feasible within the energy limit of ion implantation. This means the field-stop layer 24 can be formed by means of ion implantation. Therefore, the IGBT of the invention can be produced employing an inexpensive wafer such as an FZ wafer as in a non-punch-through type IGBT with high yields. In addition, provision of the field-stop layer allows the base layer 2 to be as thin as in a punch-through type IGBT, thus reducing losses. In short, the IGBT of the invention is low-cost as a non-punch-through type IGBT and low-loss as a punch-through type IGBT.

In the above-described aspects of embodiments of the invention, the depth of the field-stop layer 24 is not larger than 3 μm and the collector layer 9 is shallower than the field-stop layer 24. Accordingly, the amount of carriers stored in the base layer 2, field-stop layer 24, and the collector layer 9 is insignificant. As a result, an ideal turn-off waveform is obtained as shown in FIG. 24.

Figure 24:
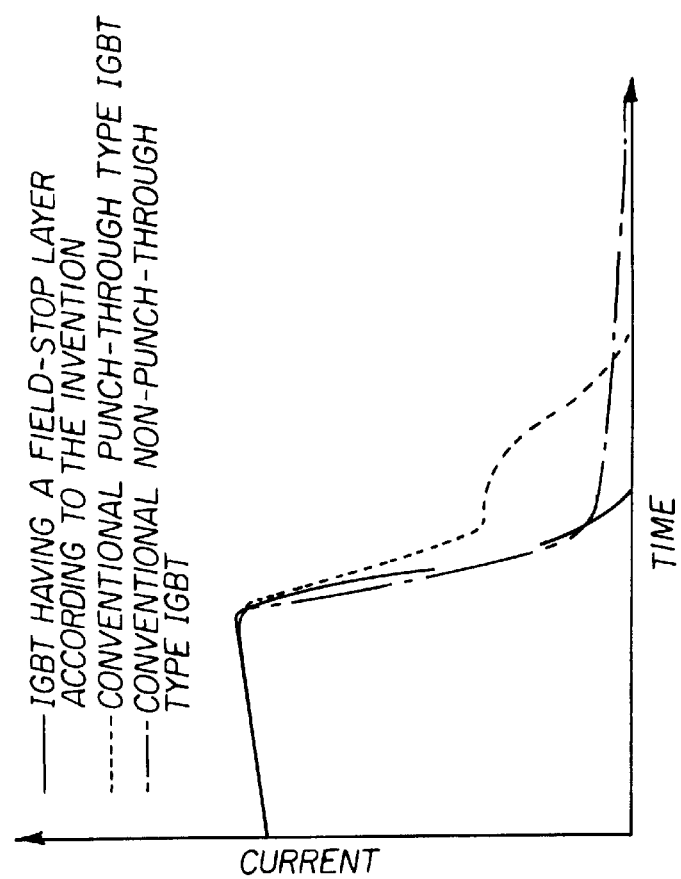
FIG. 24 is a chart showing turn-off waveforms obtained by simulations for an IGBT of an embodiment of the present invention and two conventional IGBTs, all the IGBTs having the same on-state voltage drop.

FIG. 24 shows the turn-off waveforms obtained by simulations for three IGBTs having the same on-state voltage drop. The IGBTs are: (1) an embodiment of the invention provided with a field-stop layer 24, (2) a conventional non-punch-through type IGBT, and (3) a conventional punch-through type IGBT. The IGBT of (2) exhibits low but long-lasting tail current because this type of an IGBT has a thick base layer storing large amount of carriers. The IGBT of (3) exhibits large tail current due to the carriers stored in the buffer layer and the collector layer. In contrast, the IGBT of (1) according to the invention has overcome the drawbacks of the IGBTs (2) and (3) mentioned above, and exhibits insignificant tail current and an ideal turn-off waveform.

The invention is not limited to the specific forms described. The structures of the emitter and the gate, for example, are not limited to the aspects described in the foregoing. Although most of the description has been made with reference to an example of an IGBT having blocking voltage of 1,200 V class, the present invention can be applied to all the IGBTs having blocking voltages of 500 V, 600 V, 900 V, 1,400 V, 1,700 V, 1,800 B, 2,000 V, 2,500 V, 3,300 V, and other voltage classes. The invention covers all modifications and equivalents within the spirit and scope of the invention.

In an IGBT according to the invention, the field-stop layer that is an impurity diffusion layer is formed in a principal surface region of a semiconductor substrate with the depth not larger than 3 μm that is the maximum depth practically feasible within the energy limit of ion implantation. That is, this impurity diffusion layer may be formed by means of ion implantation. Therefore, the IGBT of the invention can be produced employing in expensive wafer such as an FZ wafer like in a non-punch-through type IGBT with high yields.

Moreover, provision of the field-stop layer allows the base layer to be as thin as in a punch-through type IGBT, to obtain an IGBT with reduced losses. An IGBT according to the invention is low-cost as a non-punch-through type IGBT and low-loss as a punch-through type IGBT.

What is claimed is:

1. A semiconductor device comprising:

a base layer formed by an n-type semiconductor substrate having resistivity uniform in a thickness direction;

a p-type channel diffusion region, an n-type emitter diffusion region, an emitter electrode, a gate-insulating film, and a gate electrode formed in one principal surface region of said substrate;

a p-type collector layer and a collector electrode formed in a second principal surface region of said substrate; and an n-type impurity diffusion layer having an impurity concentration higher than an impurity concentration in said base layer and being provided between said collector layer and said base layer, wherein a thickness of said impurity diffusion layer defined by Xfs–Xj is in a range from 0.5 μm to 3 μm, where Xfs is a position at which said impurity concentration of said impurity diffusion layer equals twice said impurity concentration of said base layer and Xj is a position of a junction between said impurity diffusion layer and said collector layer;

wherein a voltage at which said base layer completely depletes lies in a range from 0.45 to 0.7 times a blocking voltage of said semiconductor device.

2. A semiconductor device comprising:

a base layer formed by an n-type semiconductor substrate having resistivity uniform in a thickness direction;

a p-type channel diffusion region, an n-type emitter diffusion region, an emitter electrode, a gate-insulating film, and a gate electrode formed in one principal surface region of said substrate;

a p-type collector layer and a collector electrode formed in a second principal surface region of said substrate; and an n-type impurity diffusion layer having an impurity concentration higher than an impurity concentration in said base layer and being provided between said collector layer and said base layer, wherein a thickness of said impurity diffusion layer defined by Xfs–Xj is in a range from 0.5 μm to 3 μm, where Xfs is a position at which said impurity concentration of said impurity diffusion layer equals twice said impurity concentration of said base layer and Xj is a position of a junction between said impurity diffusion layer and said collector layer;

wherein a peak value of an impurity concentration of said collector layer is larger than 15 times a peak value of said impurity concentration of said impurity diffusion layer.

3. A semiconductor device comprising:

a base layer formed by an n-type semiconductor substrate having resistivity uniform in a thickness direction;

a p-type channel diffusion region, an n-type emitter diffusion region, an emitter electrode, a gate-insulating film, and a gate electrode formed in one principal surface region of said substrate;

a p-type collector layer and a collector electrode formed in a second principal surface region of said substrate; and an n-type impurity diffusion layer having an impurity concentration higher than an impurity concentration in said base layer and being provided between said collector layer and said base layer, wherein a thickness of said impurity diffusion layer defined by Xfs–Xj is in a range from 0.5 μm to 3 μm, where Xfs is a position at which said impurity concentration of said impurity diffusion layer equals twice said impurity concentration of said base layer and Xj is a position of a junction between said impurity diffusion layer and said collector layer;

wherein an impurity concentration at said position of said junction between said collector layer and said impurity diffusion layer is not less than $4 \times 10^{16}$ cm$^3$.

4. A semiconductor device comprising:

a base layer formed by an n-type semiconductor substrate having resistivity uniform in a thickness direction;

a p-type channel diffusion region, an n-type emitter diffusion region, an emitter electrode, a gate-insulating film, and a gate electrode formed in one principal surface region of said substrate;

a p-type collector layer and a collector electrode formed in a second principal surface region of said substrate; and an n-type impurity diffusion layer having an impurity concentration higher than an impurity concentration in said base layer and being provided between said collector layer and said base layer, wherein a thickness of said impurity diffusion layer defined by Xfs–Xj is in a range from 0.5 μm to 3 μm, where Xfs is a position at which said impurity concentration of said impurity diffusion layer equals twice said impurity concentration of said base layer and Xj is a position of a junction between said impurity diffusion layer and said collector layer;

wherein an average impurity concentration in said impurity diffusion layer is not less than $1 \times 10^{15}$ cm$^{-3}$.

5. A semiconductor device comprising:

a base layer formed by an n-type semiconductor substrate having resistivity uniform in a thickness direction;

a p-type channel diffusion region, an n-type emitter diffusion region, an emitter electrode, a gate-insulating film, and a gate electrode formed in one principal surface region of said substrate;

a p-type collector layer and a collector electrode formed in a second principal surface region of said substrate; and an n-type impurity diffusion layer having an impurity concentration higher than an impurity concentration in said base layer and being provided between said collector layer and said base layer, wherein a thickness of said impurity diffusion layer defined by Xfs–Xj is in a range from 0.5 μm to3 μm, where Xfs is a position at which said impurity concentration of said impurity diffusion layer (U equals twice said impurity concentration of said base layer and Xj is a position of a junction between said impurity diffusion layer and said collector layer;

wherein an average impurity concentration in said impurity diffusion layer is not less than 15 times an impurity concentration in said base layer.

6. A semiconductor device comprising:

a base layer formed by an n-type semiconductor substrate having resistivity uniform in a thickness direction;

a p-type channel diffusion region, an n-type emitter diffusion region, an emitter electrode, a gate-insulating film, and a gate electrode formed in one principal surface region of said substrate;

a p-type collector layer and a collector electrode formed in a second principal surface region of said substrate; and an n-type impurity diffusion layer having an impurity concentration higher than an impurity concentration in said base layer and being provided between said collector layer and said base layer, wherein a thickness of said impurity diffusion layer defined by Xfs–Xj is in a range from 0.5 μm to 3 μm where Xfs is a position at which said impurity concentration of said impurity diffusion layer equals twice said impurity concentration of said base layer and Xj is a position of a junction between said impurity diffusion layer and said collector layer;

wherein a dose into said impurity diffusion layer is in a range from $3 \times 10^{11}$ cm$^{-2}$ to $1 \times 10^{12}$ cm$^{-2}$.

7. A semiconductor device comprising:

a base layer formed by an n-type semiconductor substrate having resistivity uniform in a thickness direction;

a p-type channel diffusion region, an n-type emitter diffusion region, an emitter electrode, a gate-insulating film, and a gate electrode formed in one principal surface region of said substrate;

a p-type collector layer and a collector electrode formed in a second principal surface region of said substrate; and an n-type impurity diffusion layer having an impurity concentration higher than an impurity concentration in said base layer and being provided between said collector layer and said base layer, wherein a thickness of said impurity diffusion layer defined by Xfs–Xj is in a range from 0.5 μm to 3 μm, where Xfs is a position at which said impurity concentration of said impurity diffusion layer equals twice said impurity concentration of said base layer and Xj is a position of a junction between said impurity diffusion layer and said collector layer;

wherein a voltage at which said impurity diffusion layer and said base layer set up punch-through at 25° C. is not lower than 1.54 times a voltage that is determined by avalanche breakdown of a pn junction existing on a surface of said semiconductor device.

8. A semiconductor device comprising:

a base layer formed by an n-type semiconductor substrate having resistivity uniform in a thickness direction;

a p-type channel diffusion region, an n-type emitter diffusion region, an emitter electrode, a gate-insulating film, and a gate electrode formed in one principal surface region of said substrate;

a p-type collector layer and a collector electrode formed in a second principal surface region of said substrate; and an n-type impurity diffusion layer having an impurity concentration higher than an impurity concentration in said base layer and being provided between said collector layer and said base layer, wherein a thickness of said impurity diffusion layer defined by Xfs–Xj is in a range from 0.5 μm to 3 μm, where Xfs is a position at which said impurity concentration of said impurity diffusion layer equals twice said impurity concentration of said base layer and Xj is a position of a junction between said impurity diffusion layer and said collector layer;

wherein a voltage at which said impurity diffusion layer and said base layer set up punch-through at 25° C. is not greater than 0.84 times a voltage that is determined by avalanche breakdown of a pn junction existing on a surface of said semiconductor device.

* * * * *

UNITED STATES PATENT AND TRADEMARK OFFICE
CERTIFICATE OF CORRECTION

PATENT NO.     : 6,621,120 B2  
DATED          : September 16, 2003  
INVENTOR(S)    : Masahito Otsuki et al.

It is certified that error appears in the above-identified patent and that said Letters Patent is hereby corrected as shown below:

<u>Title page,</u>
Item [56], References Cited, U.S. PATENT DOCUMENTS,
Please add -- US-5,723,890  *  3/1998  Fujihira et al. --

Signed and Sealed this

Sixteenth Day of December, 2003

JAMES E. ROGAN
*Director of the United States Patent and Trademark Office*